US005736887A

United States Patent [19]

Spence

[11] Patent Number: 5,736,887

[45] Date of Patent: Apr. 7, 1998

[54] FIVE VOLT TOLERANT PROTECTION CIRCUIT

[75] Inventor: John R. Spence, Villa Park, Calif.

[73] Assignee: Rockwell International Corporation, Newport Beach, Calif.

[21] Appl. No.: 590,382

[22] Filed: Jan. 25, 1996

[51] Int. Cl.$^6$ ........ H03L 5/00

[52] U.S. Cl. ........ 327/333; 327/108; 326/81

[58] Field of Search ........ 326/62, 80, 81, 326/113; 327/108, 112, 319, 333

[56] References Cited

U.S. PATENT DOCUMENTS

| | | | |
|---|---|---|---|
| 4,080,539 | 3/1978 | Stewart | 326/81 |
| 4,216,390 | 8/1980 | Stewart | 326/81 |
| 4,763,023 | 8/1988 | Spence | 307/480 |
| 4,806,795 | 2/1989 | Nakano et al. | 326/81 |
| 4,963,766 | 10/1990 | Lundberg | 326/81 |
| 4,978,867 | 12/1990 | Pfennings | 326/80 |
| 5,013,937 | 5/1991 | Aoki | 326/81 |
| 5,128,560 | 7/1992 | Chern et al. | 326/81 |
| 5,530,672 | 6/1996 | Konishi | 326/81 |
| 5,539,335 | 7/1996 | Kobayashi et al. | 326/81 |
| 5,541,546 | 7/1996 | Okumura | 327/333 |

OTHER PUBLICATIONS

Sedra & Smith, "Microelectronic Circuits", Saunders College Publishing, Philadenphia 1991, pp. 315, 316,381 & 382.

*Primary Examiner*—Timothy P. Callahan
*Assistant Examiner*—Jeffrey Zweizig
*Attorney, Agent, or Firm*—William C Cray; Susie H. Oh

[57] ABSTRACT

A low voltage driver tolerant of high voltage and suitable for driving a processor and a memory device. A first protection NFET is coupled to the drains of a series-coupled PFET and NFET forming the basic driver components. Another protection NFET is connected in series to the first NFET. This second protection NFET requires approximately 1 volt for turn on, such that a resultant 3 volts appear at the output of the complete driver assembly. When the output driver is not enabled and 5 volt inputs are being applied from the memory circuit, the two NFET protection transistors block the 5 volts from reaching the processor output driver.

13 Claims, 4 Drawing Sheets

FIVE VOLT TOLERANT PROTECTION CIRCUIT

BACKGROUND OF THE INVENTION

1. Field of the Invention

The present invention relates to semiconductor circuit drivers and, more particularly, to a low voltage driver for driving semiconductor memory devices having thin oxide construction.

2. Related Art

In today's metal oxide semiconductor (MOS) technologies, the sizes and power requirements of the MOS devices are continually shrinking. Using MOS oxide processes to increase transistor speed, the gate oxides must be very thin and the channel lengths must be very short. Consequently, as the demand for extremely fast transistors increases, the need for thinner oxides and shorter channel lengths likewise increases. For example, the recent half-micron technology is driven by the need to thin out the gate oxide and shorten channel lengths of the transistors. Channel length is defined as the length of the electrode (in microns) which controls conduction in a MOS transistor. This electrode has a certain thickness necessary to insulate it from the source and drain terminals of the MOS transistor. Prior to the development of half-micron MOS transistors, these channel lengths have been continuously shortening, for example, from 2 microns to 1.6 microns to 1 micron and so forth. By shortening the channel lengths, the die size can be smaller and the device can operate faster. As a result, more transistors can be formed on a single chip, and more chips can be constructed on a single wafer.

Often newer technologies need to interface with older ones. For example, a process or design using 0.5 micron transistors often are used to operate with a memory made with an older process. However, such memories may have to interface voltage levels which go back to transistor-transistor-logic (TTL) requirements, making it difficult to interface with newer processors due to a mismatch in power supplies. That is, such transistor technology is constrained by the power supplies which are typically available in computer processor arrangements. The need to balance and maximize the combination of thin gate oxide MOS devices in a newer processor with lower driving voltages is simply limited by cost and availability constraints of the external memory device to which it is interfacing. Basically, older 5 volt memories are less costly and more available than 3 volt memory devices. Conventional 5 volt power supply sources, however, can damage half-micron transistors in the processor device as these thin oxide transistors have a tendency to break down under such loads.

Two considerations affect the ability of the MOS transistor to withstand a 5 volt power supply; one is gate oxide thickness (typically 90 angstroms), and another is channel length (typically 0.5 micron). These transistors operate safely with 3 volt power supplies but can be damaged by a 5 volt power supply. The damage is catastrophic when the voltage from gate to drain or source exceeds the insulator breakdown voltage. For example, a permanent short circuit can occur, thereby rendering the device useless, when the drain to source voltage equals 5 volts. In such instances, a phenomenon called punch-through may occur, whereby a large current flows, causing the device to suffer permanent thermal damage.

Accordingly, a lower voltage across the gate is necessary to maintain the gate oxide of the transistor. The use of a lower voltage, however, creates an interface problem between the processor which stores and loads data from associated memory devices, such as a static RAM. The interface between these two types of electronic components must enable information flow between the processor to the memory if data is being written externally or read from the memory. However, in many standard electronic systems, the memory is typically powered by a 5 volt supply, while the processor is powered by 3 volts. This inconsistency thus leads to problems of permanent damage or large fault currents.

As illustrated in FIG. 1(*a*), the signal processor 110 is coupled to a memory 112 via an interface 114. The signal processor 110 generally includes a driver 116 and a receiver 118. (FIG. 1(*b*)) Similarly, the memory 112 also includes a driver 122 and a receiver 120. The driver and receiver arrangement on either end may be transmitting control signals such as read and write commands, or may be sending data or address information. As can be seen, a symmetrical assembly is provided to accurately transmit and receive data and commands from either side. However, due to the mutual nature of such processor and memory arrangements, as in many bi-directional systems, the voltage supplied to one side must be compatible with that supplied to the other side.

Referring to FIG. 1(*c*), a conventional driver 130 for the processor includes a p-type metal oxide semiconductor (PMOS) PFET 132 coupled to an n-type MOS (NMOS) NFET 134. The transistor coupling provides sufficient current for the processor to drive the digital address and data information to the external memory. The driver 130 is typically powered by a 3 volt power supply which is included in PC in which the processor is installed. Symmetrically, the conventional memory driver 136 also incorporates a PMOS PFET 138 and an NMOS NFET 140. However, because many commonly-used memories are powered by 5 volt supplies which also must be included in the PC in which they are installed, a two volt discrepancy between the processor and the memory results. When the processor outputs through its driver 130, the memory driver 136 floats. Data input is accepted through memory receiver 120. At this point, no incompatibility will exist since most memories operate acceptably with TTL levels, although with 3 volts the processor will exceed these levels. However, in reverse, a problem arises. The memory delivers data through its driver 136, and the processor receives data through its receiver 118. Driver 130 is then put in a float state. It is in this state that the driver 130 can be damaged by 5 volt interface signals from the memory.

For example, if the processor driver 130 is floating, both the PFET 132 and the NFET 134 are off, and the memory 136 is driving from its 5 volt power supply and delivering a 5 volt signal to the signal processor 130. Examining the transistors individually, the NFET 134 is effectively grounded, while the PFET 132 is set at $V_{dd}$, the drain voltage. A 5 volt supply would thus be seen at output node 142, from the drain to the gate of the NFET 134. That is, 5 volts would be produced across the oxide of the transistor 134 which, in turn, could rupture the oxide and destroy transistor NFET 134. The PFET 132, however, would not be affected since 3 volts are already being supplied to it, such that the 2 volt difference between the driving 5 volts and the existing 3 volts would not rupture the transistor. The PFET, however, would be affected in a different way. A diode 135 inherently exists in PFET 132. This diode provides a current path from the external input from the 5 volt memory to the processor's 3 volt power supply. Large currents can occur. This can cause latch-up in the processor which disables its ability to function.

One way to protect the NFET is to provide a second NFET 210 in series with the driver and connect a permanent 3 volt supply to its gate, as illustrated in FIG. 2. If the memory driver voltage supply varies from 0 volt to 5 volts, the maximum voltage difference seen by the processor driver would only be 3 volts with a 0 volt input ($V_{gate}-V_{in}$)=3 volts−0 volt=3 volts). For a 5 volt supply, a voltage difference of 2 volts ($V_{gate-Vin}$)=3 volts−5 volts=2 volts) would be seen at the drain of the protection transistor 210, and thus at the NFET 134. Unlike the driver without a protection transistor, 2 and 3 volt levels across the gate oxide would be substantially more tolerable by the driver, because it would not degrade the NFET.

However, the implementation of such a protection transistor does not deliver sufficient voltage to the memory when the output goes high. The resultant processor driving voltage output by the processor driver 130 and provided to the memory thus equals the input voltage supply $V_{dd}$ minus a threshold voltage $V_t$ necessary to turn on the protection NFET 210. Referring to FIG. 2, the processor driver turns its PFET 132 on which delivers 3 volts to the drain of protection NFET 210. With 3 volts on its drain and 3 volts on its gate, NFET 210 produces a reduced voltage level on its source because of threshold loss $V_t$. For example, if $V_{dd}$=3 volts and if $V_t$=1 volt, the maximum voltage that can be delivered to the memory is 2 volts due to the threshold loss. The low 2 volt supply, however, is not enough because the minimum voltage needed by the memory generally a TTL level of 2.8 volts. This is generally the minimum level input receiver 120 (FIG. 1) must have to deliver a valid input to its internal memory.

Looking at the typical NFET and PFET, the NFET can discharge a node completely to $V_{ss}$ but can only charge an output to $V_{dd}-V_t$. As explained in more detail below, $V_{ss}$ is the designation often used for "ground." The PFET, on the other hand, can charge an output to $V_{dd}$ but can only discharge it to $V_{ss}+V_t$. In driving an output, the PFET is connected to $V_{dd}$ and the output, and the NFET is connected to $V_{ss}$ and the output pad, which generally comprises the output metalization to which the driver is connected on the "chip" and to which the external bond wire to the package is connected. This results in the FET typically being connected and used as shown in FIGS. 1(*c*) and 2. However, as described above, a protection arrangement is necessary to prevent damage to the driver transistors.

SUMMARY OF THE INVENTION

A low voltage driver which is tolerant of a high voltage power supply according to an embodiment of the invention is particularly suitable for providing protection to the transistors comprising the driver to enable operational coupling between a processor and a memory device. A first protection NFET is coupled to the drains of the series-coupled PFET and NFET which form the basic driver components. The first protection NFET provides protection to the basic driver NFET. A 3 volt level is applied to the gate of the first protection NFET when the output from the series connection is low. This level is determined by a control signal.

Another protection NFET is connected parallel to the first NFET. A 4 volt level is applied to the gate of this NFET when the output of the series connected FETs is high, e.g., at 3 volts. Accordingly, when the PFET of the driver is turned on by internal control logic, and when 4 volts are applied to the gate of the second protection NFET, the output of the driver arrangement produces 3 volts. That is, the 3 volt output level from the output driver is switched to the output through the second protection NFET 328 which, at that time, has 4 volts connected to its gate which is developed by an internal supply booster controlled by local clocks and control signals. This second protection NFET requires approximately 1 volt for turn on, such that a resultant 3 volts (4 volts−1 volt=3 volts) appear at the output of the complete driver assembly. When the output driver is not enabled and 5 volt inputs are being applied from the memory circuit, the two NFET protection transistors block the 5 volts from reaching the processor output driver. Consequently, the maximum voltage which gets to the driver in this mode is ($V_{dd}-V_t$)=3−1=2 volt.

Embodiments of the present invention thus enable the output of the driver to be driven to $V_{ss}$ (normally 0 volts), yet the driver may also drive to $V_{dd}$=3V even though the output is being coupled by NFETs, since the gate of one of the NFETs is driven to 4 volts at this time. Also, the 5 volts supplied to the memory device are prevented from being driven to the processor components, which could thereby destroy the driver transistors. Thus, when the processor is driving the memory it provides logic levels of 0V and 3V which are adequate for the memory since a 5V memory normally can operate with TTL levels of 2.8 volt minimum and 0.8V maximum. When the memory drives the processor, it provides levels of 0V and 5V. The 5V is the dangerous level but it is blocked by the NFET protection scheme of the present invention from damaging the internal transistors of the processor.

DETAILED DESCRIPTION OF THE PREFERRED EMBODIMENTS

Figure 3:
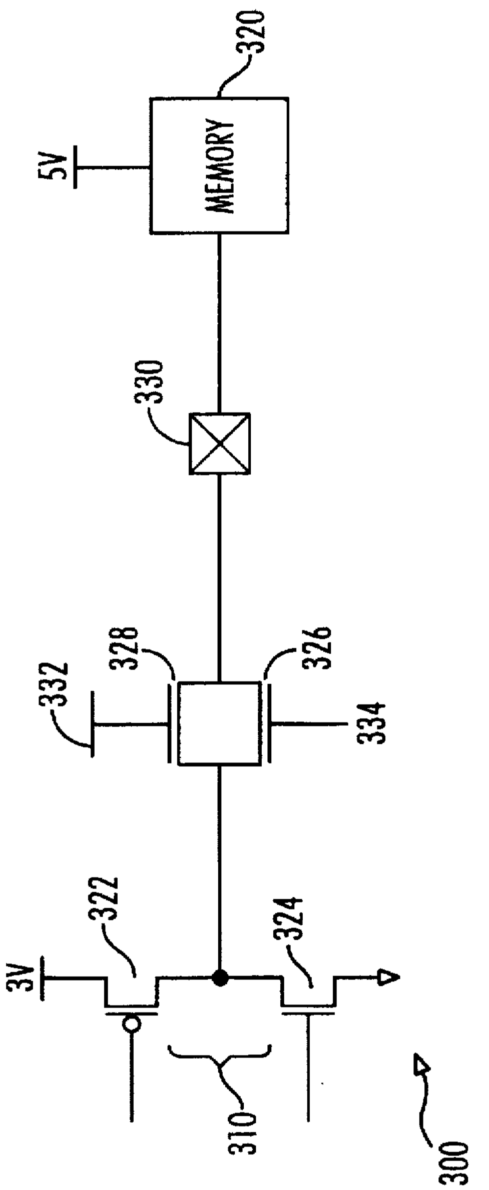
FIG. 3 is a diagram of a protection circuit according to an embodiment of the present invention.

A five volt tolerant driver protection circuit in accordance with a preferred embodiment of the present invention is indicated generally at 300 in FIG. 3. In the illustrated circuit, several desirable driver functions are performed. In protection circuit embodiments of the present invention, the output of the driver 310 is connected to the output pad 330 to enable the PAD to be driven to $V_{ss}$ through the series combination of transistors 324, 326, and 328. The circuit also allows the pad 330 to be driven to $V_{dd}$ even though the protection circuit is in series with the output. In order to do this, the gate of transistor 328 is maintained at a voltage of $V_{dd}+V_t$(4V) when the driver 310 is producing 3V. Thus, embodiments of the present invention are simply appended to the standard CMOS driver without disturbing its drive capability, while preventing the output transistors of the processor from being exposed to voltages greater than 3.3 volts. It will be recognized that references to 3 volts or 3.3 volts are generally directed to equivalent voltages which are standard in the electronics industry.

FIG. 3 shows a standard CMOS driver 310 including a PFET 322 and an NFET 324. Table 1 indicates voltage levels on protection transistors 328 and 326 for three possible output conditions: high, low, and float. The two parallel NFETs 326 and 328 are connected between the output of the driver 310 and output pad 330, which is also connected to 5 volt memory device 320. When the driver is floating, i.e., the driver is not used and no voltage is being driven to the input of the protection circuit, voltage is supplied to the gates of transistors 328 and 326. Transistor 326 receives 3 volts at its gate from $V_{dd}$ at supply node 334. Transistor 328 receives 2 volts ($V_{dd}$–$V_t$) at its gate 332. Accordingly, two possible conditions can occur. If the memory 320 provides 5 volts in, the total voltage difference across transistor 326 is 2 volts (5 volts–3 volts), and is 3 volts for transistor 328 (5 volts–2 volts). If the data being written to the output pad of the processor from the memory is at 0 volts, the difference between the voltage on the gate of transistor 328 and the voltage coming in from the memory 320 would be 2 volts, and for transistor 326 would be 3 volts.

TABLE 1

| Output | Transistor 328 Gate Voltage | Transistor 326 Gate Voltage |
|---|---|---|
| Low | $V_{dd} - V_t$ | $V_{dd}$ |
| High | $V_{dd} + V_t$ | $V_{dd}$+ |
| Float | $V_{dd} - V_t$ | $V_{dd}$ |

With regard to transistor 326, the gate voltage 334 is 3 volts. When the memory 320 inputs 5 volts, the difference between the 3 volt gate voltage of transistor 326 and the memory supply equals 2 volts. And when the memory inputs 0 volts, the difference to the gate voltage of transistor 326 is 3 volts. Accordingly, embodiments of the invention limit the difference voltages for both transistors 326 and 328 to 2–3 volts, rather than the direct 5 volts provided at the output of the memory 320.

Thus, it can be seen that protection circuit embodiments of the present invention, when coupled to a standard processor driver and a voltage source, protect the driver from a variety of voltages that may be applied. Not only is protection provided when the driver circuit is not being used, but $V_{ss}$ is switched through the protection circuit from driver 310 when the circuit is driving low, at which point a zero level signal is being transmitted between the processor and the memory. Similarly, $V_{dd}$ is switched through the protection circuit from driver 310 when it is driving high, e.g., binary one level data is transmitted.

Figure 4:
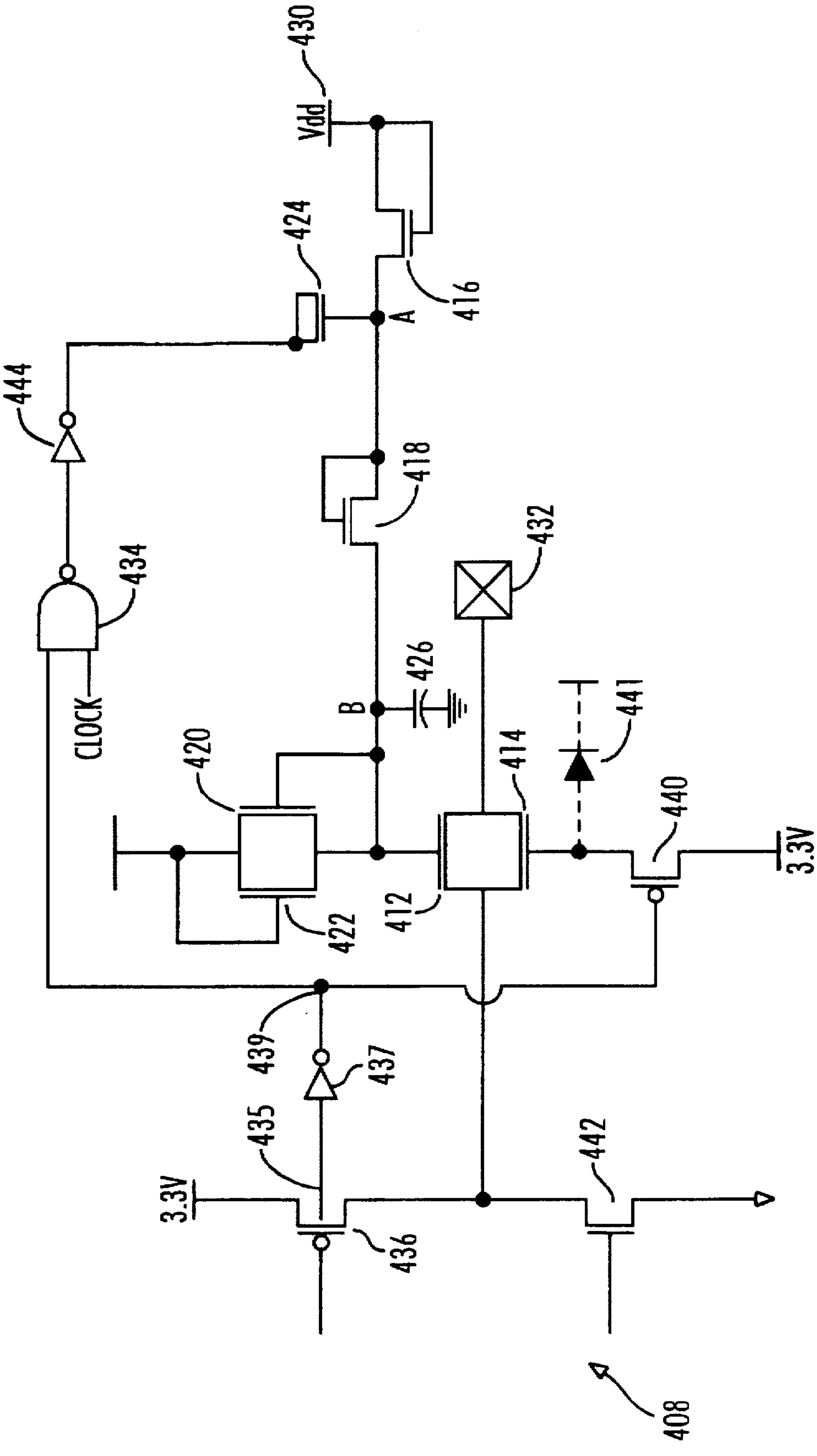
FIG. 4 shows another embodiment of the protection circuit of the present invention.

FIG. 4 illustrates an alternate embodiment of the invention. In FIG. 4, transistor 414 has $V_{dd}$ switched directly to its gate. "Bootstrapping" is used to control the drive voltage on the gate of transistor 412 included in the protection circuit 410. The gate voltage of transistor 412 must be driven at a voltage higher than $V_{dd}$, similar to the discussion above with regard to the embodiment of FIG. 3. This is required when the driver 408 switches to a high level ($V_{dd}$) and outputs to the pad 432 through transistor 412. The maximum voltage that can be output to the pad is the gate voltage of transistor 412 minus $V_t$. Thus, this gate voltage must be approximately 4 volts to be able to output a $V_{dd}$ level of 3 volts.

As shown in FIG. 4, the driving circuit 408 comprises transistors 436 and 442. The bootstrapping circuit includes two transistors 416 and 418 and capacitors 424 and 426, with an input source 430 at $V_{dd}$, which in preferred embodiments is 3 volts. Preferably, transistor 416 is connected as a MOS diode as shown, such that if no clocks are operating, node A will be held at $V_{dd}$ minus the threshold voltage, which equals 2 volts. Thus, capacitor 424 will charge up to $V_{dd}$ minus the threshold voltage. Nand gate 434 controls one of the plates of capacitor 424. If the output driver 408 is driving low, line 435 coupled to the gate of transistor 436 will be high, which switches node 439 low through inverter 437. This disables the nand gate 434 and forces its output to go high, such that the output of inverter 444 is low, which holds the plate of capacitor 424 low. In the case where the driver 408 is driving high, node 435 is low and node 439 is forced high, which enables nand gate 434. As a result, the output of nand gate 434 will alternately switch high and low at the clock rate which alternately switches inverter 444 high and low. As the output of inverter 444 is switched between high and low, the voltage at node A will immediately jump from 2 volts to 5 volts. Concurrently, the increase of voltage at node A to 5 volts causes transistor 418, which is also connected as a MOS diode, to turn on and thereby charge up capacitor 426.

The voltage at node B is accordingly affected by the increase in the voltage at node A. Node A is coupled to node B through transistor 414. The voltage level at node B is determined by the original voltage at node A, which was $V_{dd}$–$V_r$. This is increased by an amount $V_{dd}$ when inverter 444 is switched high by the clock. When this occurs, node A will be at 2 $V_{dd}$–$V_r$. Consequently, the voltage coupled to node B is reduced to $2V_{dd}2$–$V_t$ because of the threshold voltage loss in transistor 418. In addition, the capacitance ratio of C1 and C2 also reduces this voltage. As capacitor 426 is parallel to capacitor 424, a capacitor divider function is formed which determines the voltage at node B. The voltage increase at node B is controlled by the capacitor ratio:

$$V_{node\ B} = \frac{C2}{C1 + C2}\,(2V_{dd} - 2V_t)$$

where C1 corresponds to capacitor 424 and C2 corresponds to capacitor 426. In preferred embodiments, the capacitances provide a voltage of 4 volts at node B.

As shown, in the preferred embodiment of FIG. 4, capacitor 424 includes the gate and source and drain of a MOS transistor. A MOS transistor connected in this way acts as a capacitor between the source/drain and the gate. The drain and source are one capacitor plate, while the opposite plate is the gate. When the alternating voltage from inverter 444 is applied to the source drain, it is coupled through this capacitance to the gate. Similarly, capacitor 426 is preferably the equivalent load capacitance of transistor 412. In other words, capacitor 424 is an intentionally placed MOS capacitor and capacitor 426 is the equivalent capacitance of transistors 412, 420 and 422. When driver 408 drives to 3 volts, i.e., its power supply level, the gate of transistor 412 is at 4 volts. The 3 volts is conducted through NFET 412, and is provided to the output, in this case, pad 432. The gate of transistor 412 is boosted to a level higher than $V_{dd}$ 430, which allows the output to switch goes from a logical 0 to a logical 1, i.e., from 0 volts to 3 volts.

As described above, the dock is gated by a signal from the processor which is activated when the driver outputs to the pad 432. Preferably, the clock includes a nand gate 434 receiving a control signal 435 input from the driver 408. The control signal 435 enables the clock signal to be applied to the source/drain plate of capacitor 424 when the driver drives high to 3 volts. More particularly, as indicated in FIG. 4, when the control signal 435 is low, i.e., 0, the inverter 438 output is high, which enables the clock to be coupled to the drain/source of capacitor 424. Preferably, to prevent node B from exceeding 4 volts, a MOS diode (transistor 420) is implemented to clamp node B to $V_{dd}$+$V_r$, or 4 volts (3 volts+1 volt). Conversely, if the control signal is high, or 1, nand gate 434 is disabled, the source drain of capacitor C1 is held at $V_{ss}$, and the voltage at the gate of transistor 412 is no longer boosted, but will remain at $V_{dd}-V_r$. In this condition, node B will be at $V_{dd}2-V_t$ because of the coupling path through MOS connected diode 418. However, as this has been found to be undesirable, in preferred embodiments, transistor diode 422 is connected to $V_{dd}$ which increases the voltage at node B to $V_{dd}-V_r$. Thus, preferably, MOS transistor diode 422 acts as a clamp transistor, and is coupled to a 3 volt supply to hold node B at $V_{dd}-V_t$ which equals 2 volts (3 volts−1 volt) when the output driver is driving low.

Thus, transistor diode 422 is active when the driver is low or floats, whereas transistor diode 420 is active when the driver is high. In the case where the driver is driving high, the source/drain plate of capacitor 424 is coupled to the clock, and transitions between high and low, rather than merely being connected to ground. As a result, the voltage of node A will go to $2V_{dd}-V_r$, or 5 volts, which provides the boost. This voltage is coupled to node B through diode connected transistor 418 which reduces the voltage as previously described to $2V_{dd}-2V_t$ which equals 4 volts.

According to embodiments of the invention, one of the purposes of transistor 412 is to allow the output of the driver 408 to drive high through it to the output pad 432. The primary purpose of transistor 414 is to allow the output of driver 408 to drive low through it to the output pad. Accordingly, since the gate of transistor 414 is coupled to $V_{dd}$ through transistor 440, which acts as a switch to connect the gate of transistor 414 to 3 volts, when the output of driver 408 drives low, transistor 440 will be on to apply $V_{dd}$ (3 volts) directly to the gate of transistor 414. Thus, the output node at pad 432 will also be driven low through the driver and transistor 414.

When the driver 442 is driving high, transistor 414 effectively "assists" transistor 412. They operate in parallel. The gate of transistor 412 is boosted to 4 volts as previously described. Transistor 440 is turned off since the output of inverter 437 is high. Consequently, the gate of transistor 414 is floated with a voltage of 3 volts left on its gate. It is therefore ON and able to help transistor 412 connect the high output of driver 408 to the pad 432. A secondary effect occurs on the gate of transistor 414 known as self-bootstrapping. As the output pad 432 is transitioning from 0 volts to 3 volts, it is capacitively coupled to the gate of transistor 414, raising its voltage from 3 volts to a higher level. The level is limited by a diode 441 (shown in phantom lines), which is an inherent effect of transistor 440, to $V_{dd}+0.6$ volts =3.6 volts. Hence, very little current is being delivered the output as the output nears 3 volts, since the transistor 414 is nearing its threshold limit.

Figure 5:
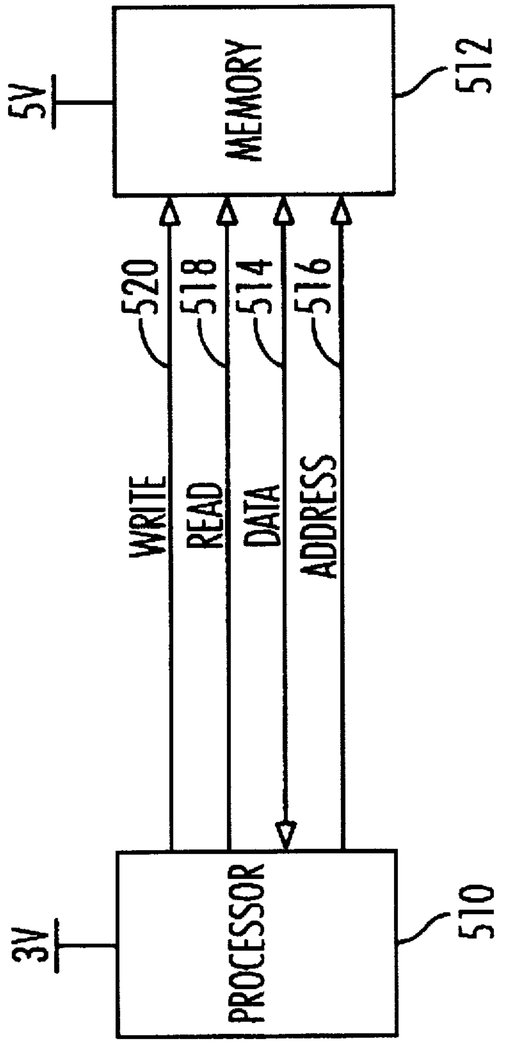
FIG. 5 is a diagram of a general processor/memory scheme.

In operation, as illustrate in the system diagram of FIG. 5, a processor 510 coupled to a 3 volt power supply is coupled to a memory device 512 which is powered by 5 volts. An interface to the memory consists of address lines 516, data lines 514, and READ and WRITE controls 518 and 520. For example, there may be up to 24 address lines with unidirectional address outputs from the processor to the memory. These address outputs, however, are not affected by the 3 to 5 volt difference because they go directly to receivers in the memory, such that the 5 volt source does not return to the processor across the address lines.

Figure 1A:
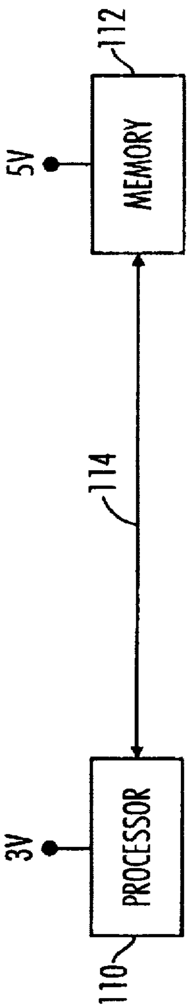
FIG. 1(a) PRIOR ART
FIGS. 1(*a*), and 1(*c*), show conventional configurations of signal processor and memory driving arrangements.
Figure 1B:
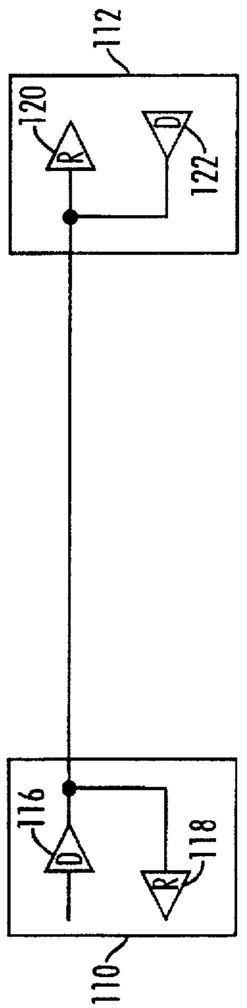
FIG. 1(b) PRIOR ART
Figure 1C:
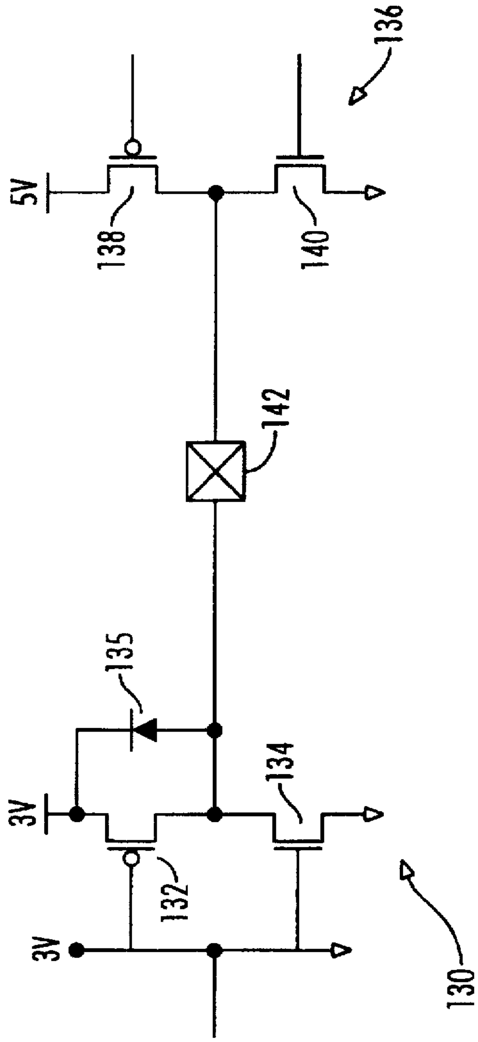
FIG. 1(c) PRIOR ART
Figure 2:
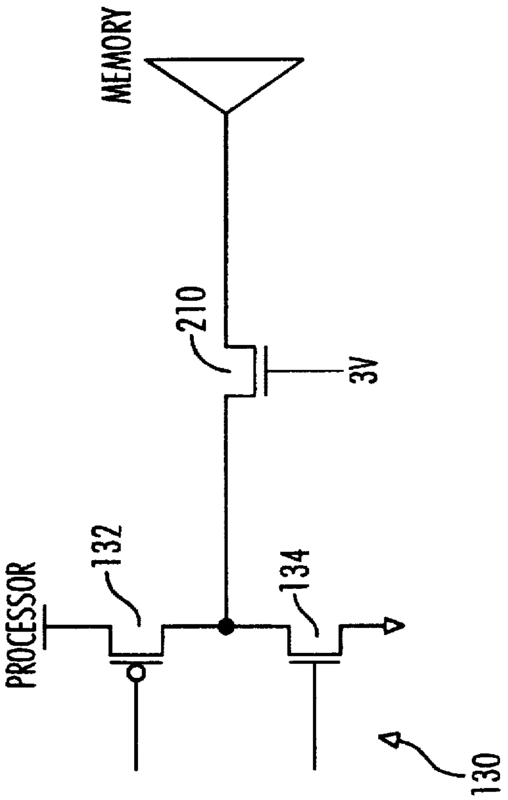
FIG. 2 PRIOR ART
FIG. 2 is a diagram of another conventional circuit arrangement.

In the case of bi-directional signal lines, however, high voltage compatibility problems may occur. There is generally no difficulty when the processor 510 is driving the memory 512 from 0 to 3 volts because the mast current memories are capable of operating at TTL levels. However, the case is not true in reverse with bi-directional signals. When a READ operation is performed from the external memory, the processor receivers will be enabled to read the data coming from the memory 512. (See FIG. 1) In this instance, the processor driver will float to avoid contention between the memory driver which would be trying to drive at the same time as the processor driver. Thus, as the processor driver is floating, the memory is sending back binary information at 0 and 5 volt levels. Yet, the processor driver must be able to withstand the 5 volt memory voltage without being destroyed.

Thus, embodiments of tie present invention enable the processor driver to tolerate the 5 volt return supply from the external memory. As explained above, embodiments of the present invention allow the driver 408 to swing between a "0" condition of 0 volts and a "1" condition of 3 volts, while simultaneously allowing an external memory device to be powered by 5 volts. Consequently, when the processor driver is unused, i.e., floating, and the memory is driving in 5 volts as information is being transmitted from the memory to the processor, the driver will not be damaged by the 5 volt signal because the gates of the transistors 412 and 414 in series with the output driver in the processor provide intermediate voltages to limit the voltage differences between the input voltage of 5 volts and the gate voltage of the susceptible processor transistors to less than 3 volts.

What is claimed is:

1. A circuit driver coupled to a first electronic component having a first component input voltage, the circuit driver enabling the first electronic component to drive a second electronic component having a second component input voltage which is higher than the first component input voltage to protect the first electronic component from the higher second electronic component input voltage, the circuit driver having a driver input and a driver output, the output being coupled to the second electronic component, the driver comprising:

a first transistor having a first source, a first gate and a first drain, the first source being coupled to a first input voltage having an associated threshold voltage necessary to be turned on;

a second transistor having a second source, a second gate and a second drain, the second source being coupled in series to the first drain of the first transistor, wherein the first and second gates of the first and second transistors, respectively, are coupled to the first electronic component;

a third transistor coupled between the intersection of the first and second transistors and the driver output, the third transistor receiving a second input voltage; and a fourth transistor coupled in parallel to the third transistor, and receiving a third input voltage, such that the maximum voltage across the third and fourth transistors and being received by the first electronic component via the first and second transistors is less then the second component input voltage supplied to the second electronic component.

2. The circuit driver of claim 1, wherein when the second component input voltage supplied to the second electronic component is provided to the driver output, the third input voltage has a voltage level equivalent to either the first input voltage minus the threshold voltage or the first input voltage plus the threshold voltage, depending upon the driver input.

3. The circuit driver of claim 1, wherein the first input voltage is less than the input voltage supplied to the second electronic component.

4. The circuit driver of claim 2, wherein when the driver output is low, high, or floating, the voltage across the third gate is equivalent to the first input voltage.

5. The circuit driver of claim 4, wherein when the driver output is low or floating the voltage at the fourth gate is equivalent to the first input voltage minus the threshold voltage, and when the driver output is high the voltage at the fourth gate is equivalent to the first input voltage plus the threshold voltage, such that the maximum voltage across the parallel coupling of the third transistor to the fourth transistor, received at the intersection of the first and second transistors, is less than the voltage input to the second electronic component.

6. A protection circuit including a circuit driver coupled to an electronic device for enabling the electronic device to drive a memory device coupled thereto at a voltage lower than a voltage supplied to the memory device, the circuit driver having an input and an output, the output being coupled to the memory device, the circuit comprising:

a first transistor having a first input voltage Vdd and a threshold voltage Vt necessary to turn on the first transistor;

a second transistor coupled in series to the first transistor;

a third transistor coupled to the intersection of the first and second transistors and the output of the circuit driver, the third transistor having a second input voltage; and a fourth transistor coupled in parallel to the third transistor, and receiving a third input voltage having a voltage level of Vdd−Vt or Vdd+Vt depending upon the input of the circuit driver, such that when the circuit driver is either high or low while driving the memory device and when the driver is floating, the voltage at the third transistor is Vdd, and the voltage at the fourth transistor when driving is Vdd+Vt and when floating is Vdd−Vt.

7. The circuit driver of claim 6, wherein the memory voltage is approximately 5 volts and the first and second input voltages are approximately 3 volts, while the third input voltage varies between 2 and 4 volts, such that the voltage supplied to the processor is limited to approximately 3 volts.

8. A protection circuit for driving a processor and associated electronic component arrangement coupled thereto, the processor having a processor supply voltage and the associated component having a component voltage which is higher than the processor supply voltage, wherein the protection circuit protects the processor from receiving the component voltage, the protection circuit comprising:

a driver circuit including a first transistor coupled to a second transistor, the first transistor having a first input voltage;

a first protection transistor coupled to the driver circuit;

a second protection transistor connected in parallel to the first protection transistor, the second protection transistor having a drain, source, and gate, the gate having a corresponding gate drive voltage;

a bootstrapping circuit for controlling the gate drive voltage of the second protection transistor such that the gate drive voltage is higher than the first input voltage, the bootstrapping circuit including:

a first bootstrapping transistor having a low voltage supply and a threshold voltage for activation, a second bootstrapping transistor connected to the first bootstrapping transistor, and a first bootstrapping capacitor having a first end and a second end, the first end being coupled to the connection of the first and second bootstrapping transistors, wherein the connection between the first bootstrapping capacitor and the first and second bootstrapping transistors defines a node A having a voltage; and a clock circuit coupled to the first bootstrapping capacitor, the clock circuit having a clocking input which alternates between high and low levels, the clock circuit including:

a NAND gate having an input and an output, the input of the NAND gate for receiving the clocking input, and an inverter coupled between the output of the NAND gate and the first bootstrapping capacitor, wherein the voltage at node A alternates between high and low levels as the clocking input alternates between low and high levels respectively.

9. The protection circuit of claim 8, wherein the first bootstrapping transistor functions as a diode such that node A is held at the low voltage supply minus the threshold voltage of the first bootstrapping transistor.

10. The protection circuit of claim 8, wherein the first bootstrapping capacitor comprises a transistor.

11. The protection circuit of claim 8, further comprising a second bootstrapping capacitor coupled between the second bootstrapping transistor and ground, wherein if the voltage at node A is high, the second bootstrapping transistor activates and charges up the second bootstrapping capacitor, wherein the connection of the second bootstrapping capacitor to the second bootstrapping transistor defines a node B.

12. The protection circuit of claim 11, further comprising:

a first capacitive transistor coupled to the first protection transistor for holding the voltage at node B to the low supply voltage minus the threshold voltage; and a second capacitive transistor coupled in series with the first capacitive transistor for clamping the voltage at node B to the low supply voltage plus the threshold voltage;

wherein the first and second capacitive transistors and the first protection transistor have associated capacitances equivalent to the capacitance of the bootstrapping capacitor.

13. The protection circuit of claim 8, wherein a control signal is provided by the driver circuit, and wherein the NAND gate includes:

a first input line which receives the control signal, and a second input line which receives the clocking signal.

* * * * *